(12) United States Patent
Sekiguchi

(10) Patent No.: US 7,813,402 B2
(45) Date of Patent: Oct. 12, 2010

(54) SURFACE EMITTING LASER AND METHOD OF MANUFACTURING THE SAME

(75) Inventor: Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 244 days.

(21) Appl. No.: 12/143,337

(22) Filed: Jun. 20, 2008

(65) Prior Publication Data
US 2009/0003401 A1    Jan. 1, 2009

(30) Foreign Application Priority Data
Jun. 29, 2007    (JP)    ............... 2007-171579

(51) Int. Cl.
*H01S 5/00*    (2006.01)
(52) U.S. Cl. ............. 372/46.01; 372/45.01; 372/50.124
(58) Field of Classification Search ............. 372/43.01, 372/44.01, 45.01, 46.013, 50.11, 50.124; 438/39; 257/E21.002
See application file for complete search history.

(56) References Cited

U.S. PATENT DOCUMENTS

| | | | | |
|---|---|---|---|---|
| 5,314,838 A | * | 5/1994 | Cho et al. ..................... | 438/32 |
| 6,075,802 A | * | 6/2000 | Stolz et al. ............... | 372/46.01 |
| 6,529,541 B1 | | 3/2003 | Ueki et al. ..................... | 372/96 |
| 6,639,927 B2 | * | 10/2003 | Sato et al. .............. | 372/46.013 |
| 6,650,683 B2 | * | 11/2003 | Ueki et al. ..................... | 372/96 |
| 7,016,392 B2 | * | 3/2006 | Tandon et al. .................. | 372/96 |
| 2004/0004985 A1 | * | 1/2004 | Zhu et al. ..................... | 372/46 |
| 2007/0014324 A1 | * | 1/2007 | Maeda et al. ............. | 372/46.01 |
| 2007/0223546 A1 | * | 9/2007 | Brenner et al. ........... | 372/43.01 |
| 2007/0284604 A1 | * | 12/2007 | Slater et al. .................... | 257/98 |
| 2008/0254566 A1 | * | 10/2008 | Yokouchi et al. .............. | 438/93 |
| 2010/0046565 A1 | * | 2/2010 | Masui et al. ............. | 372/45.01 |

FOREIGN PATENT DOCUMENTS

| | | |
|---|---|---|
| JP | 2002-208755 A | 7/2002 |
| JP | 2004-288902 | 10/2004 |

* cited by examiner

*Primary Examiner*—Minsun Harvey
*Assistant Examiner*—Delma R Forde
(74) *Attorney, Agent, or Firm*—Fitzpatrick, Cella, Harper & Scinto

(57) ABSTRACT

Provided is a surface emitting laser which can maintain a fundamental transverse mode to obtain higher power while higher-order transverse mode oscillations are suppressed, and a method of manufacturing the surface emitting laser. The surface emitting laser includes: an aperture portion to be a path for injecting a current to an active layer; a current confinement region provided in the vicinity of the aperture portion; and a current injection region which is provided on an opposite side to a light output side with respect to the active layer therebetween, in which a current injection path in the current injection region has a smaller diameter than the aperture portion.

13 Claims, 5 Drawing Sheets

SURFACE EMITTING LASER AND METHOD OF MANUFACTURING THE SAME

BACKGROUND OF THE INVENTION

1. Field of the Invention

The present invention relates to a surface emitting laser and a method of manufacturing the surface emitting laser, and more particularly, to a surface emitting laser for realizing higher power and improved quantum efficiency with a fundamental transverse mode and a method of manufacturing the surface emitting laser.

2. Description of the Related Art

A conventional vertical cavity surface emitting laser (hereinafter, referred to as VCSEL) employs a structure in which the diameter of a light emitting region is narrowed to approximately 5 μm in order to obtain laser oscillation of a fundamental transverse mode.

Therefore, the volume of an active layer region becomes smaller, thereby reducing the optical power.

In order to solve this problem, a surface emitting semiconductor laser in which higher-order transverse mode oscillations are suppressed without affecting the fundamental transverse mode oscillation is proposed in Japanese Patent Application Laid-Open No. 2002-208755.

FIG. 5 shows a surface emitting semiconductor laser in which a lower n-type distributed Bragg reflector (DBR) layer 103, an active region 104, and an upper p-type DBR layer 106 are provided above a semiconductor substrate 101.

An upper p-type electrode 108 having an aperture portion 127 serving as a laser light output region is formed above the upper p-type DBR layer 106. A current confinement region 124 is formed as an oxidized region.

According to the surface emitting semiconductor laser having the structure described above, the aperture diameter of the current confinement region 124 and the aperture diameter of the upper p-type electrode 108 are determined based on the reflectance of a cavity corresponding to the upper p-type electrode 108 such that the optical loss difference of the cavity between the higher-order transverse mode and the fundamental transverse mode of laser light becomes larger.

That is, the aperture diameter of the current confinement region which is provided in the vicinity of the active layer (active region) and inserted to limit a current path and the aperture diameter of the upper p-type electrode provided to output laser light are determined as described above. Therefore, high optical power is achieved in the fundamental transverse mode.

In a light emitting device having a mesa structure, a current confinement region provided in the vicinity of an active layer is greatly effective to reduce a leak current flowing through a processed surface of the mesa structure. Therefore, the current confinement region is extremely important for a high-efficiency mesa type VCSEL.

On the other hand, laser oscillation depends not only on reflection characteristics of a cavity but also on light emission recombination (gain) distribution of the active layer.

In particular, in the current confinement region having an aperture portion for limiting a path for current (for confining current) to be injected to the active layer by an oxidized region, the current is confined to the aperture portion. However, the current concentrates on a peripheral region of the aperture portion, so the gain necessarily becomes larger, thereby exciting the higher-order transverse mode. Therefore, in the structure in which the reflection loss of the cavity is controlled to realize the fundamental transverse mode oscillation as disclosed in Japanese Patent Application Laid-Open No. 2002-208755, the gain in the higher-order transverse mode increases as described above, so the reflection loss of the cavity increases to suppress the higher-order transverse mode.

Thus, the conventional example as described above has a problem in conversion efficiency (quantum efficiency) between injection power and optical power.

In addition, the conventional example has a problem in that, a difference between a refractive index of the oxidized region of the current confinement region and a refractive index of a non-oxidized region is large, so the light emitting device becomes a refractive index waveguide type in which waveguide light is strongly confined and has a waveguide structure in which the higher-order transverse mode is easily obtained.

SUMMARY OF THE INVENTION

The present invention has been made in view of the above-mentioned problems. An object of the present invention is to provide a surface emitting laser which can maintain a fundamental transverse mode to obtain higher power while higher-order transverse mode oscillations are suppressed, and a method of manufacturing the surface emitting laser.

According to the present invention, there are provided a surface emitting laser having the following structure and a method of manufacturing the surface emitting laser.

A surface emitting laser according to the present invention includes: an aperture portion which is a path for injecting a current to an active layer; a current confinement region provided on a circumference of the aperture portion; and a current injection region which is provided on an opposite side to a light output side with respect to the active layer therebetween, in which a current injection path in the current injection region has a smaller diameter than the aperture portion.

In the surface emitting laser according to the present invention, the current confinement region has an intensity equal to or smaller than 50% of a maximum intensity of a light intensity distribution in the active layer.

In the surface emitting laser according to the present invention, the diameter of the current injection path in the current injection region Di and the diameter of the aperture portion Do satisfy the following relation (1):

$$Di < Do - 4(\mu m) \quad (1).$$

In the surface emitting laser according to the present invention, the current injection region is bonded to a wiring pattern formed on the substrate.

In the surface emitting laser according to the present invention, the substrate including the wiring pattern is one of a silicon substrate, an alumina substrate, and a CuW substrate with an insulating film formed thereon.

In the surface emitting laser according to the present invention, the substrate including the wiring pattern is a silicon substrate and includes a drive circuit for driving the surface emitting laser.

In a surface emitting laser array according to the present invention, any one of the surface emitting lasers described above is arranged one-dimensionally or two-dimensionally.

According to the present invention, a method of manufacturing the surface emitting laser including a current confinement region having an aperture portion which is a path for injecting a current to an active layer includes: forming a surface emitting laser pattern of a mesa structure on the substrate, the surface emitting laser pattern including a layer for forming the current confinement region; forming in the layer for forming the current confinement region the aperture portion which is the path for injecting the current to the active layer; insulating a circumference of the aperture portion to form the current confinement region; and forming at a center of a top portion of the mesa structure a current injection region of which a current injection path has a smaller diameter than the aperture portion of the current confinement region on an opposite side to a light output side with respect to the active layer therebetween.

The method of manufacturing the surface emitting laser according to the present invention further includes facing and bonding a surface on which the current injection region has been formed with a different substrate having a wiring pattern formed thereon after the current injection region is formed.

The method of manufacturing the surface emitting laser according to the present invention further includes removing the substrate used in the step of forming the surface emitting laser pattern after the step of facing and bonding the surface on which the current injection region has been formed with the different substrate having the wiring pattern formed thereon.

In the method of manufacturing the surface emitting laser according to the present invention, the substrate used in the step of forming the surface emitting laser pattern of the mesa structure is a GaAs substrate and the substrate used in the step of facing and bonding the surface on which the current injection region has been formed with the different substrate having the wiring pattern formed thereon is a silicon substrate.

A surface emitting laser according to the present invention includes on a substrate a p-type electrode, a p-type DBR, a layer, an active layer, an n-type DBR, and an n-type electrode, arranged in the stated order from a side of the substrate. The layer includes a current confinement region and an aperture portion surrounded thereby and a current injection region comprised of a part of the p-type electrode has a smaller diameter than the aperture portion to prevent an injection current from concentrating on a circumference of the aperture portion.

According to the present invention, the fundamental transverse mode can be maintained to obtain higher power while the higher-order transverse mode oscillations are suppressed.

Further features of the present invention will become apparent from the following description of an exemplary embodiment with reference to the attached drawings.

DESCRIPTION OF THE EMBODIMENTS

Hereinafter, a surface emitting laser according to an embodiment of the present invention will be described in detail in accordance with the accompanying drawings.

Figure 1:
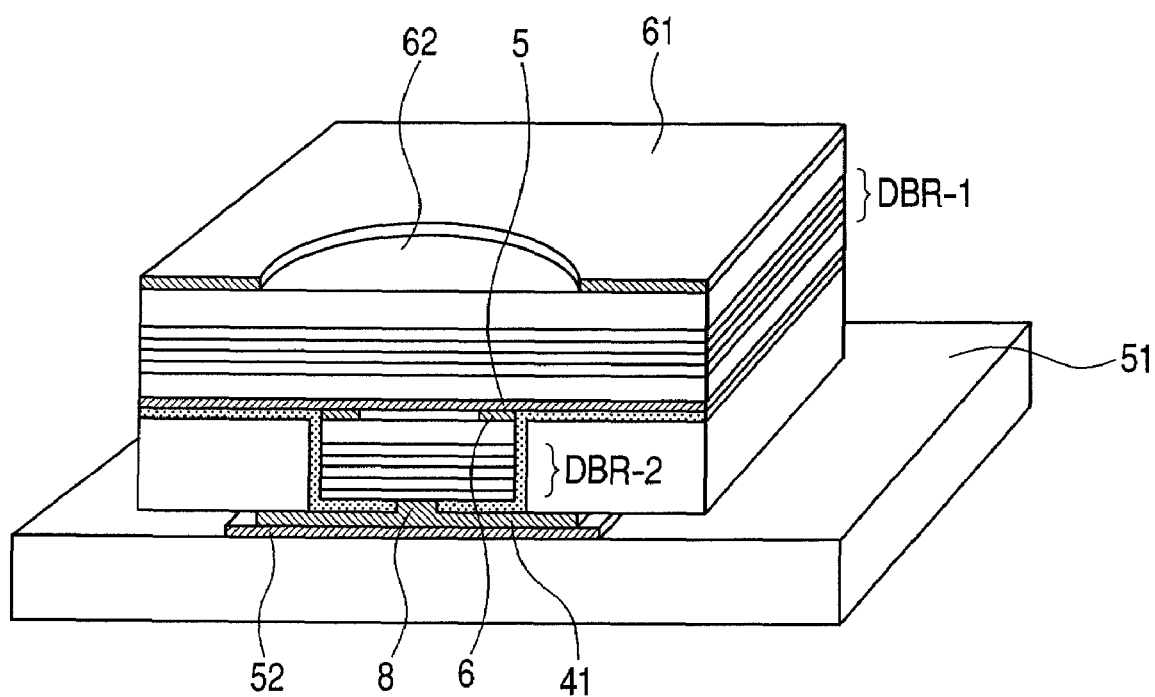
FIG. 1 is a schematic explanatory perspective view illustrating a structural example of a surface emitting laser according to an embodiment of the present invention.

FIG. 1 is a schematic explanatory perspective view illustrating a structural example of the surface emitting laser according to this embodiment.

In FIG. 1, the surface emitting laser includes an active region 5, a current confinement region 6, a current injection region 8, a p-type metal electrode (lower electrode) 41, a silicon substrate 51, a metal wiring 52, an n-type metal electrode (upper electrode) 61, and a light emitting window 62.

The surface emitting laser according to this embodiment further includes an upper multilayer film reflector DBR-1 and a lower multilayer film reflector DBR-2 which sandwich the active region (active layer) 5. The upper multilayer film reflector DBR-1, the lower multilayer film reflector DBR-2, and the active region 5 constitute a cavity.

The n-type metal electrode (upper electrode) 61 is located above the cavity. The p-type metal electrode (lower electrode) 41 is located below the cavity. The light emitting window 62 for outputting laser light is provided in the n-type metal electrode 61. The current injection region 8 is formed in the p-type metal electrode 41 on the opposite side to the light output side of the light emitting window 62.

The current confinement portion (current confinement region) 6 which is provided adjacent to the active layer 5 and has an aperture portion formed by insulating a circumferential portion of a current path.

In this case, the diameter of a current injection path in the current injection region 8 of the p-type metal electrode (lower electrode) 41 is set smaller than the diameter of the aperture portion of the current confinement portion 6.

In this embodiment, the lower electrode 41 including the current injection region 8 provided on the opposite side to the light output side can be connected with a wiring of a substrate with a wiring pattern formed thereon or a wiring of a substrate with a drive circuit formed thereon for the surface emitting laser.

The substrate with the wiring pattern formed thereon may be any of a silicon substrate, a highly thermally conductive insulating substrate made of alumina, and a highly thermally conductive substrate which is made of CuW and has an insulating film formed thereon.

In this embodiment, the above-mentioned surface emitting laser can be used for a surface emitting laser array with a one- or two-dimensional arrangement.

According to the structure in this embodiment, the diameter of the current injection path in the current injection region 8 of the p-type metal electrode (lower electrode) 41 is set smaller than the diameter of the aperture portion of the current confinement portion 6. Therefore, current can be concentrated on the center region of the aperture portion of the current confinement portion 6.

Thus, it is possible to avoid an increase in gain of a higher-order transverse mode, which is caused by the concentration of the current on the circumference of the aperture portion of the current confinement portion, with the result that high power and improved quantum efficiency in a fundamental transverse mode can be realized.

Note that the diameter described here is a diameter of a cross section in parallel to the in-plane direction of the substrate.

In addition, most of the waveguide light is away from the insulated region whose refractive index significantly changes, and thus the light confinement of the waveguide is weakened, so higher-order transverse mode oscillations can be suppressed as a waveguide characteristic.

According to the structure in this embodiment, the lower electrode can be directly bonded to the substrate with the wiring pattern formed thereon or the substrate with the drive circuit formed thereon for the surface emitting laser. Therefore, when a light emitting apparatus including the drive circuit is to be assembled, the number of bonding wires in a mounting process can be reduced to reduce a size of the light emitting apparatus.

According to the structure in this embodiment, when a highly thermally conductive substrate is used as the substrate to which the surface emitting device is bonded, high optical power is obtained.

Further, in an array configuration, interference between adjacent devices can be reduced.

As described above, according to the embodiment of the present invention, the surface emitting laser includes the aperture portion serving as a path for injecting a current to the active layer and the current confinement region provided on the circumference of the aperture portion. However, the present invention is not limited to the laser and thus may be applied to a light emitting device such as an LED.

Even in this case, the feature of the present invention is that the surface emitting laser includes the current injection region provided on the opposite side to the light output side with respect to the active layer therebetween and the diameter of the current injection path in the current injection region is set smaller than the diameter of the aperture portion.

The current confinement region is desirably provided to obtain an intensity equal to or smaller than 50% of a maximum intensity of a light intensity distribution in the active layer, more preferably, an intensity equal to or smaller than 30% of the maximum intensity thereof. A lower limit of the intensity is not particularly limited and is equal to or larger than 5%, for example.

The embodiment of the present invention is described with reference to FIG. 1. Light can be output from the window of the upper electrode.

According to the surface emitting laser in the present invention, the diameter of the current injection region from the p-type metal electrode is set smaller than the diameter of the aperture portion to prevent a current from concentrating on the circumference of the aperture portion as described above. That is, the surface emitting laser according to the present invention includes a p-type electrode, a p-type distributed Bragg reflector (DBR), a current confinement region, an active layer, an n-type DBR, and an n-type electrode, which are provided on a substrate in the stated order from a side of the substrate. The aperture portion of the current confinement region is surrounded thereby. In order to prevent an injection current from concentrating on the circumference of the aperture portion, a diameter of a current injection region provided as a part of the p-type electrode is smaller than a diameter of the aperture portion.

Next, a method of manufacturing the surface emitting laser according to the embodiment of the present invention will be described.

FIGS. 2A to 2D and FIGS. 3E to 3G are explanatory views illustrating the method of manufacturing the surface emitting laser according to this embodiment.

FIGS. 2A to 2D are views illustrating the method of manufacturing the surface emitting laser according to this embodiment.

Figure 2A:
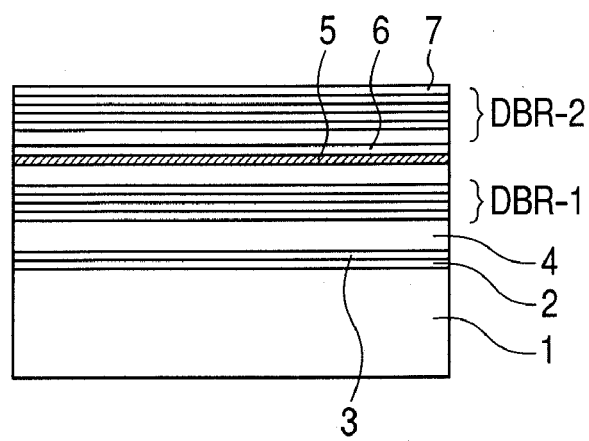
FIGS. 2A, 2B, 2C and 2D are explanatory views illustrating a method of manufacturing the surface emitting laser according to the embodiment of the present invention.
Figure 2B:
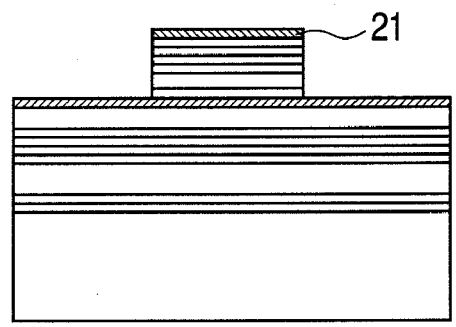
Figure 2C:
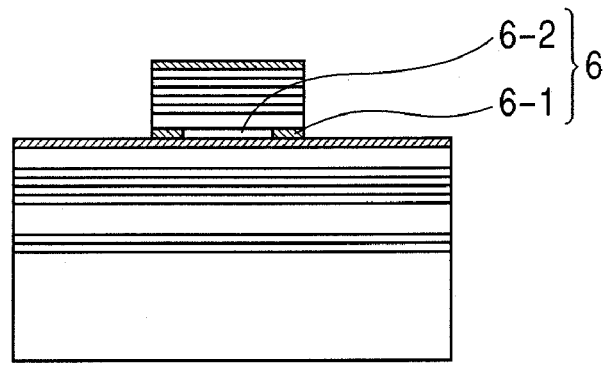
Figure 2D:
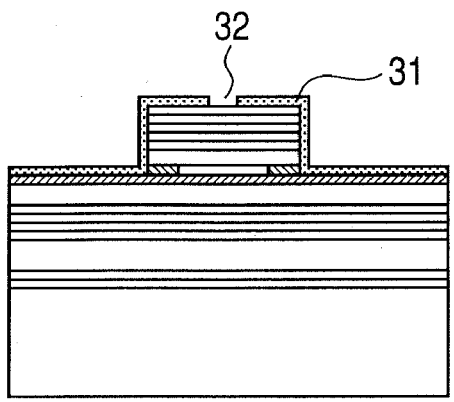
Figure 3E:
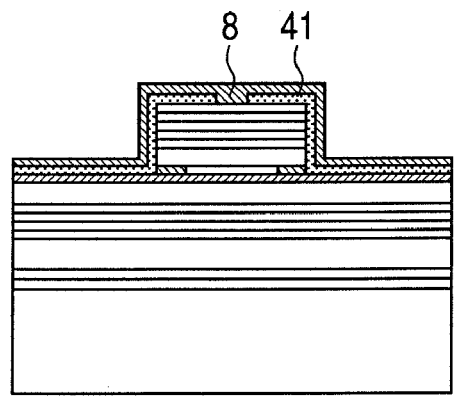
FIGS. 3E, 3F and 3G are explanatory manufacturing process views illustrating the method of manufacturing the surface emitting laser according to the embodiment of the present invention, which follow the manufacturing processes illustrated in FIGS. 2A, 2B, 2C and 2D.
Figure 3F:
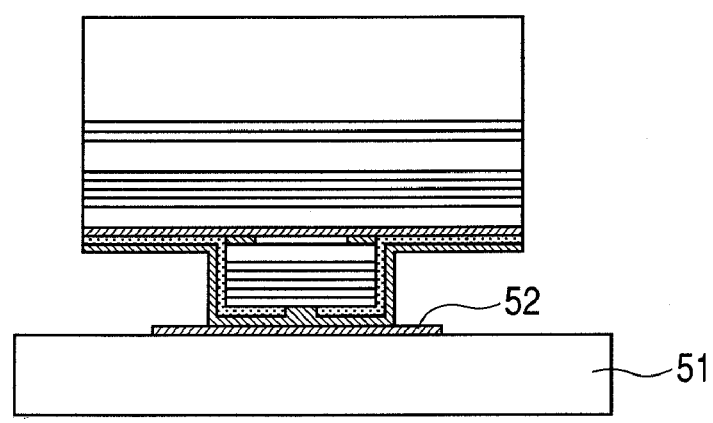
Figure 3G:
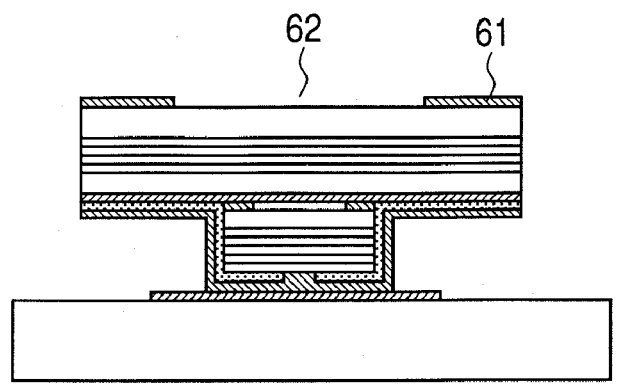

FIGS. 3E to 3G are views illustrating the method of manufacturing the surface emitting laser according to this embodiment, which follow the manufacturing processes illustrated in FIGS. 2A to 2D.

As illustrated in FIG. 2A, the following respective layers are grown on a GaAs substrate 1 by an MOCVD method which is a known technique.

That is, an n-type GaAs buffer layer 2, an n-type AlAs layer 3, an n-type $Al_xGa_{1-x}As$ layer 4, the n-type DBR layer DBR-1, an active region 5, a p-type AlAs layer 6, a p-type DBR layer DBR-2, and a p-type contact layer 7 are successively grown on the GaAs substrate 1.

The n-type DBR layer DBR-1 is a laminated structure in which an $Al_yGa_{1-y}As$ layer and an $Al_zGa_{1-z}As$ layer which are different in Al composition from each other are alternately laminated such that the film thickness of each layer is $\lambda/4n_r$ ($\lambda$ denotes laser oscillation wavelength and $n_r$ denotes refractive index of constituent medium).

The active layer 5 includes multiple quantum well layers and barrier layers which serve as a quantum structure. The active layer 5 further includes spacer layers sandwiching the quantum structure, each of which is made of undoped $Al_xGa_{1-x}As$.

The p-type AlAs layer 6 is subjected to oxidation treatment with water vapor, which will be performed later, to form the current confinement region.

The p-type DBR layer DBR-2 is a laminated structure in which an $Al_yGa_{1-y}As$ layer and an $Al_zGa_{1-z}As$ layer which are different in Al composition from each other are alternately laminated such that the film thickness of each layer is $\lambda/4n_r$. The p-type contact layer 7 forms a metal electrode to obtain ohmic contact.

Next, as illustrated in FIG. 2B, an insulating film is deposited on the entire surface of the substrate, and then etching is conducted by a photolithography process and a known etching technique until at least the p-type AlAs layer 6 is exposed, thereby forming a VCSEL pattern 21.

Subsequently, as illustrated in FIG. 2C, the exposed p-type AlAs layer 6 is selectively oxidized by wet oxidation which is a known technique from the surroundings of the mesa shape, to form a non-oxidized region (aperture portion) 6-2 surrounded by an oxidized region 6-1.

Therefore, the current confinement portion having the aperture portion serving as a current path to the active layer is formed in the vicinity of the active region.

The oxidized region of the current confinement portion provided in the vicinity of the active layer in the light emitting device having the mesa structure is greatly effective to reduce a leak current flowing through a processed surface of the mesa structure. Therefore, the current confinement region is important for a mesa type VCSEL.

In this embodiment, the aperture portion diameter of the current confinement portion formed in the vicinity of the active layer of the surface emitting device is determined depending on the diameter of the current injection region (see FIG. 1).

It is broadly desirable to form the oxidized region of the current confinement portion in a region in which the strength of electron-hole recombination in an active layer having no current confinement portion is equal to or smaller than approximately 50% of a maximum strength.

Figure 4:
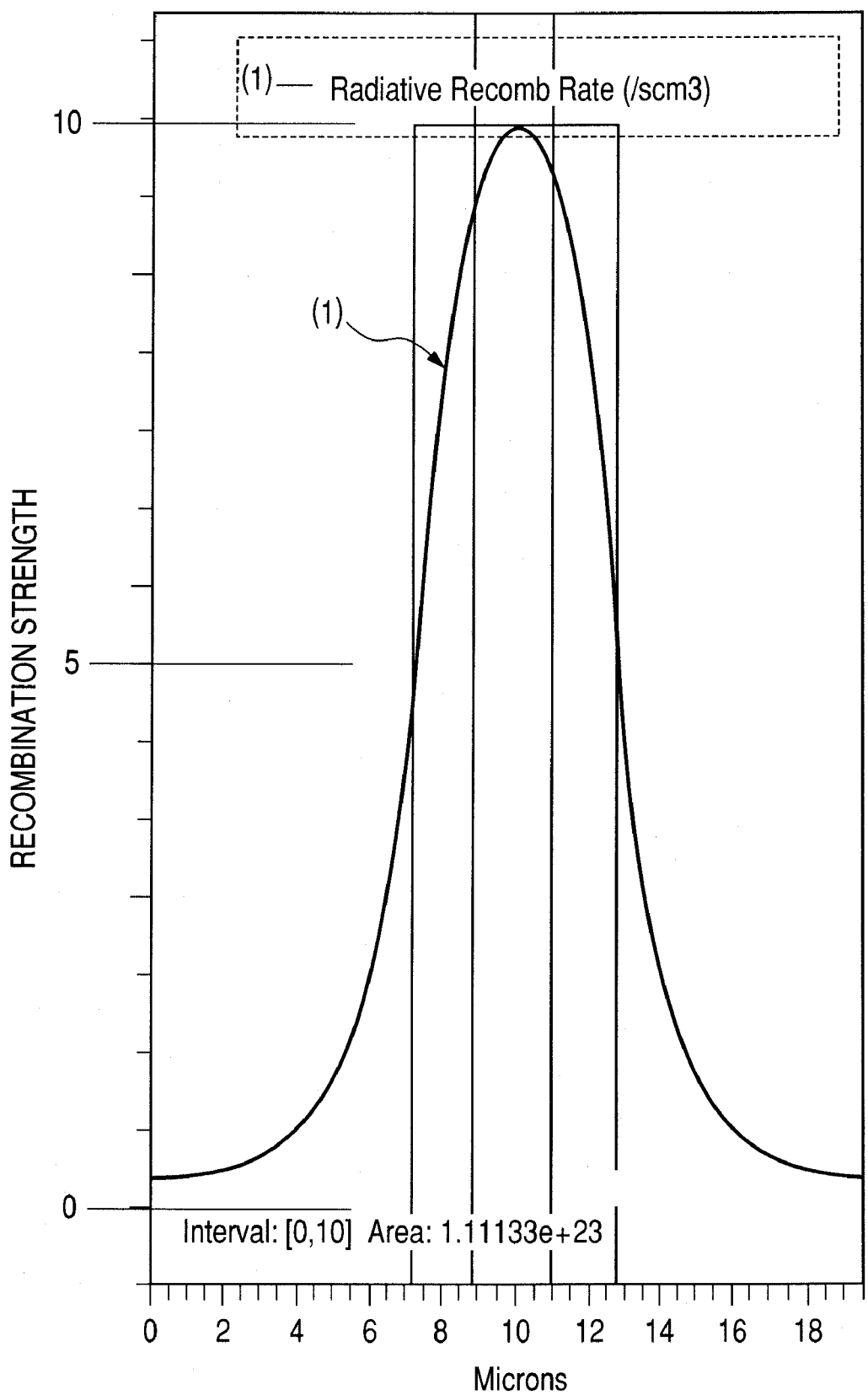
FIG. 4 is a graph illustrating a result obtained by simulation of a recombination intensity distribution of the surface emitting laser according to the embodiment of the present invention, which has a mesa structure with a current injection region of 2 μm, in a state in which a current is not confined in the vicinity of an active layer.
Figure 5:
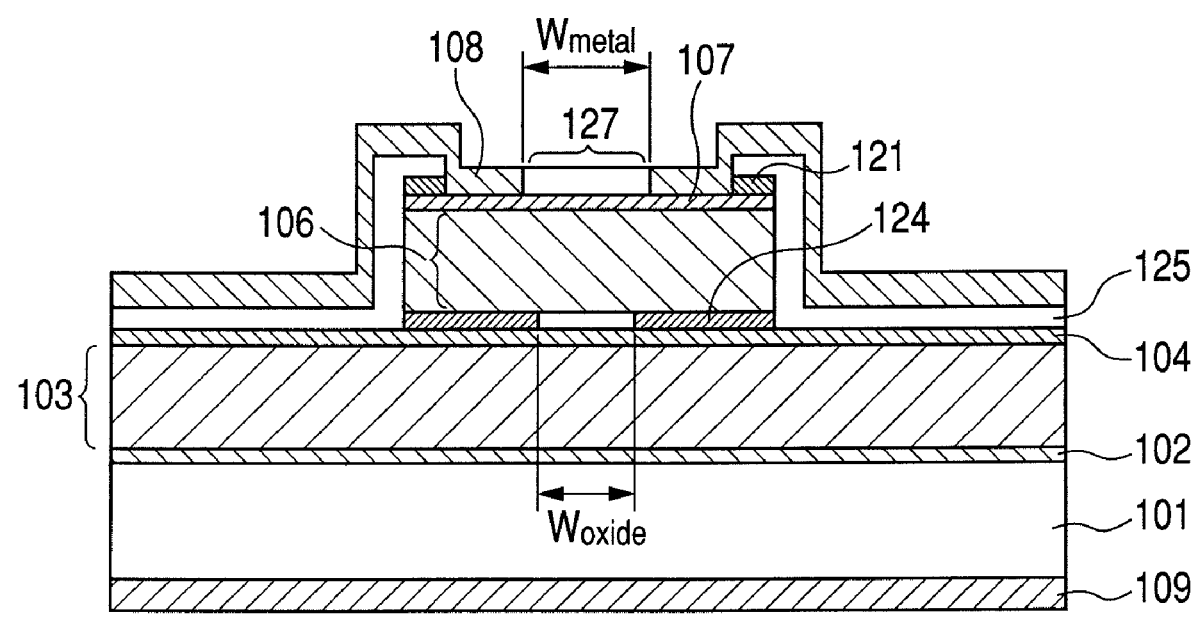
FIG. 5 is an explanatory view illustrating a structure of a conventional surface emitting laser disclosed in Japanese Patent Application Laid-Open No. 2002-208755.

FIG. 4 illustrates a result obtained by simulation of a recombination strength distribution in a state in which a current is not confined in the vicinity of the active layer in the mesa structure with the current injection region of 2 µm. A region in which the recombination strength is equal to or smaller than 50% of a maximum value in the active layer is wider than the current injection region by approximately 4 µm.

That is, when the diameter of the current injection path in the current injection region is expressed by Di and the diameter of the aperture portion in the current confinement region is expressed by Do (see FIG. 1), it is desirable to substantially satisfy the following relational expression (1).

$$Di < Do - 4 (\mu m) \quad (1)$$

Next, as illustrated in FIG. 2D, the insulating film of FIG. 2C is removed and then an insulating layer 31 is deposited to form an aperture portion 32 in the vicinity of the center of the top portion of the mesa structure.

After that, as illustrated in FIG. 3E, the p-type metal electrode 41 is successively deposited to form the current injection region 8 in a region including the aperture portion 32.

As illustrated in FIG. 3F, an insulating film is formed on the silicon substrate 51 and then the metal wiring pattern 52 corresponding to the mesa pattern of FIG. 3E is formed by a photolithography process.

The metal wiring pattern 52 and the structure of FIG. 3E are faced and bonded to each other, as illustrated in FIG. 3G.

A direct bonding technique which is a known technique can be used for the bonding.

That is, the respective metal surfaces to be bonded are cleaned and brought into contact with each other, and then heat and pressure are applied.

Next, the GaAs substrate 1 is removed by a known technique. In this embodiment, the n-type AlAs layer 3 laminated in the vicinity of the GaAs substrate 1 is selectively etched by using a hydrofluoric acid type etching solution to remove the GaAs substrate 1.

Subsequently, an n-type metal electrode having an aperture portion for outputting laser light to a removal surface produced by the selective etching is formed to complete the VCSEL.

When the silicon substrate with the wiring pattern formed thereon is used as a wafer with a circuit necessary to drive the VCSEL, a small-size light emitting apparatus can be realized. The small-size light emitting apparatus is greatly useful for an apparatus in which multiple light emitting devices are one- or two-dimensionally arranged.

In the VCSEL manufactured by the processes described above, a hole current injected from the small current injection region of the p-type (p-side) metal electrode reaches the active layer while the hole current spreads slightly laterally by diffusion. A main part of the current distribution is smaller than the aperture portion of the current confinement portion, so the current distribution is unimodal. Therefore, the light intensity distribution produced by recombination in the active layer and the intensity distribution of laser light produced by oscillating the light by DBR mirrors located above and under the active layer is also unimodal.

In a conventional example described above, the current and the light concentrate on the circumference of the aperture portion of the current confinement portion. In contrast to this, in the structure according to this embodiment, the current and the light concentrate on the center part of the aperture portion of the current confinement portion. Therefore, the influence of the vicinity of the aperture portion whose refractive index significantly changes is small and the waveguide becomes a gain waveguide type. Thus, it is difficult to produce the higher-order transverse mode.

According to the manufacturing method in this embodiment as described above, the surface emitting laser can be manufactured by a wafer process and thus the manufacturing method suitable for mass production can be realized.

EXAMPLE

A method of manufacturing a surface emitting laser according to an example of the present invention will be described.

The method of manufacturing the surface emitting laser according to this example is fundamentally not different from the manufacturing method according to the embodiment of the present invention as described above and thus will be described with reference to FIGS. 2A to 2D and FIGS. 3E to 3G used in the embodiment of the present invention.

In a first step, the respective layers are successively grown on the GaAs substrate 1 by an MOCVD method which is a known technique.

That is, the n-type GaAs buffer layer 2, the n-type AlAs layer 3, the n-type $Al_{0.25}Ga_{0.75}As$ layer 4, the n-type DBR layer DBR-1, the active region 5, the p-type AlAs layer 6, the p-type DBR layer DBR-2, and the p-type contact layer 7 are successively grown on the GaAs substrate 1 (FIG. 2A). The n-type DBR layer DBR-1 is a laminated structure in which the $Al_{0.8}Ga_{0.2}As$ layer and the $Al_{0.2}Ga_{0.8}As$ layer are alternately laminated in 29.5 cycles such that the film thickness of each layer is $\lambda/4n_r$. ($\lambda$ denotes laser oscillation wavelength and $n_r$ denotes refractive index of constituent medium).

The active region includes quantum well layers each made of undoped $Al_{0.11}Ga_{0.89}As$ and barrier layers each made of undoped $Al_{0.2}Ga_{0.8}As$, which serve as a quantum structure. The active region further includes spacer layers sandwiching the quantum structure, each of which is made of undoped $Al_{0.25}Ga_{0.75}As$.

The p-type AlAs layer 6 is subjected to oxidation treatment with water vapor, which will be performed later, to form the current confinement region.

The p-type DBR layer DBR-2 is a laminated structure in which the $Al_{0.8}Ga_{0.2}As$ layer and the $Al_{0.2}Ga_{0.8}As$ layer are alternately laminated in 40.5 cycles such that the film thickness of each layer is $\lambda/4n_r$.

The p-type contact layer 7 has a high carrier concentration to form a metal electrode to obtain ohmic contact.

Then, a mesa structure surface emitting laser pattern including a layer for forming the current confinement region is formed on the substrate.

An SiON film is deposited on an upper surface of the substrate. After that, the resist pattern 21 is formed and etching using the pattern as a mask is performed by a known etching technique until at least the p-type AlAs layer 6 is exposed, thereby forming a mesa shape whose diameter is 30 µm. Then, the resist is removed (FIG. 2B).

Then, the circumferential portion of the layer for forming the current confinement region is oxidized to form the current confinement region having the aperture portion serving as the path for injecting a current to the active layer.

The exposed p-type AlAs layer 6 is selectively oxidized by wet oxidation which is a known technique from the surroundings of the mesa shape, to form the non-oxidized region (aperture portion) surrounded by the oxidized region.

Therefore, the current confinement portion having the aperture portion serving as the current path to the active layer is formed in the vicinity of the active region (FIG. 2C).

Next, in a process for forming the current injection region whose diameter is smaller than the diameter of the aperture portion of the current confinement region at the center of the top portion of the mesa structure on the opposite side to the light output side with respect to the active layer therebetween, the current injection region is formed as follows.

The SiON film is removed and the SiN protective film (insulating layer) 31 is deposited on the entire surface. After that, the circular window (aperture portion) 32 whose diameter is 10 μm is formed substantially in the vicinity of the center of the top portion of the cylinder (FIG. 2D). Then, a Ti layer and an Au layer which serve as the P-type metal electrode 41 are successively deposited (FIG. 3E).

In a process for facing and bonding the surface on which the current injection region has been formed with a different substrate on which a wiring pattern has been formed after the formation of the current injection region, they are bonded to each other as follows.

The silicon substrate 51 having the metal wiring pattern 52 whose Au layer is exposed on the surface is separately prepared and then the metal wiring pattern 52 is faced and bonded with the structure of FIG. 3E.

The bonding is direct bonding in which the respective metal surfaces to be bonded are cleaned and brought into contact with each other, and then heat and pressure are applied (FIG. 3F).

Next, the GaAs substrate 1 is removed by a known technique.

According to a removal method in this example, the n-type AlAs layer 3 laminated in the vicinity of the GaAs substrate 1 is selectively etched by using a hydrofluoric acid type etching solution to remove the GaAs substrate 1.

Subsequently, the n-type metal electrode having the aperture portion for outputting laser light to the removal surface produced by the selective etching is formed to complete the VCSEL (FIG. 3G).

According to the structure in this embodiment, high power is obtained in the fundamental transverse mode oscillation and heat radiation is excellent. Therefore, interference between adjacent devices in an array configuration is small, mounting is easy, and a size of a light emitting device can be reduced.

Therefore, it is possible to realize a surface emitting laser suitable for a light source of a laser scanner of a copying machine and a printer which are used in an array configuration.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2007-171579, filed Jun. 29, 2007, which is hereby incorporated by reference herein in its entirety.

What is claimed is:

1. A surface emitting laser, comprising:
   an active layer;
   an aperture portion to be a path for injecting a current to the active layer;
   a current confinement region provided on a circumference of the aperture portion; and
   a current injection region provided on an opposite side to a light output side with respect to the active layer therebetween,
   wherein a current injection path in the current injection region has a smaller diameter than the aperture portion.

2. A surface emitting laser according to claim 1, wherein the current confinement region has an intensity equal to or smaller than 50% of a maximum intensity of a light intensity distribution in the active layer.

3. A surface emitting laser according to claim 1, wherein the diameter of the current injection path in the current injection region $D_i$ and the diameter of the aperture portion $D_o$ satisfy the following relation (1):

$$D_i < D_o - 4 (\mu m) \tag{1}$$

4. A surface emitting laser according to claim 1, wherein the current injection region is bonded to a wiring pattern formed on a substrate.

5. A surface emitting laser according to claim 4, wherein the substrate including the wiring pattern is one of a silicon substrate, an alumina substrate, and a CuW substrate having an insulating film formed thereon.

6. A surface emitting laser according to claim 4,
   wherein the substrate including the wiring pattern is a silicon substrate; and
   wherein on the substrate a drive circuit for driving the surface emitting laser is formed.

7. A surface emitting laser array, comprising a plurality of the surface emitting lasers according to claim 1 arranged in one of a one-dimensional arrangement and a two-dimensional arrangement.

8. A method of manufacturing a surface emitting laser including a current confinement region having an aperture portion to be a path for injecting a current to an active layer, comprising:
   forming a surface emitting laser pattern of a mesa structure on a substrate, the surface emitting laser pattern including a layer for forming the current confinement region;
   forming in the layer for forming the current confinement region the aperture portion to be the path for injecting the current to the active layer;
   insulating a circumference of the aperture portion to form the current confinement region by; and
   forming at a center of a top portion of the mesa structure a current injection region with a current injection path having a smaller diameter than the aperture portion of the current confinement region on an opposite side to a light output side with respect to the active layer therebetween.

9. A method of manufacturing a surface emitting laser according to claim 8, further comprising the step of facing and bonding a surface on which the current injection region has been formed with a different substrate having a wiring pattern formed thereon after the current injection region is formed.

10. A method of manufacturing a surface emitting laser according to claim 9, further comprising the step of removing the substrate used in the step of forming the surface emitting laser pattern after the step of facing and bonding the surface on which the current injection region has been formed with the different substrate having the wiring pattern formed thereon.

11. A method of manufacturing a surface emitting laser according to claim 9,
   wherein the substrate used in the forming the surface emitting laser pattern of the mesa structure is a GaAs substrate; and
   wherein the substrate used in the step of facing and bonding the surface on which the current injection region has been formed with the different substrate having the wiring pattern formed thereon is a silicon substrate.

12. A surface emitting laser, comprising:
    a substrate; and
    a p-type electrode, a p-type DBR, a current confinement region, an active layer, an n-type DBR, and an n-type electrode, arranged on the substrate in the stated order from a side of the substrate, wherein the aperture portion of the current confinement region is surrounded thereby; and wherein a current injection region comprised of a part of the p-type electrode has a smaller diameter than the aperture portion to prevent an injection current from concentrating on a circumference of the aperture portion.

13. A surface emitting laser according to claim 12, wherein the substrate is silicon.

* * * * *